US012581938B2

(12) United States Patent
Elsherbini et al.

(10) Patent No.: US 12,581,938 B2
(45) Date of Patent: Mar. 17, 2026

(54) PACKAGE ARCHITECTURE FOR QUASI-MONOLITHIC CHIP WITH BACKSIDE POWER

(71) Applicant: Intel Corporation, Santa Clara, CA (US)

(72) Inventors: Adel A. Elsherbini, Chandler, AZ (US); Shawna M. Liff, Scottsdale, AZ (US); Debendra Mallik, Chandler, AZ (US); Christopher M. Pelto, Beaverton, OR (US); Kimin Jun, Portland, OR (US); Johanna M. Swan, Scottsdale, AZ (US); Lei Jiang, Camas, WA (US); Feras Eid, Chandler, AZ (US); Krishna Vasanth Valavala, Chandler, AZ (US); Henning Braunisch, Phoenix, AZ (US); Patrick Morrow, Portland, OR (US); William J. Lambert, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 696 days.

(21) Appl. No.: 17/820,961

(22) Filed: Aug. 19, 2022

(65) Prior Publication Data
US 2024/0063120 A1     Feb. 22, 2024

(51) Int. Cl.
*H01L 23/528* (2006.01)
*H01L 21/48* (2006.01)
(Continued)

(52) U.S. Cl.
CPC ...... *H01L 23/5286* (2013.01); *H01L 21/4853* (2013.01); *H01L 21/4857* (2013.01);
(Continued)

(58) Field of Classification Search
CPC .............. H01L 23/5286; H01L 23/481; H01L 23/49811; H01L 23/49822;
(Continued)

(56) References Cited

U.S. PATENT DOCUMENTS

2012/0211885 A1*  8/2012  Choi ..................... H01L 25/105
                                                            257/737
2015/0179558 A1*  6/2015  Kim .................. H01L 23/49816
                                                            257/738
(Continued)

OTHER PUBLICATIONS

U.S. Appl. No. 17/891,654, filed Aug. 19, 2022.
(Continued)

*Primary Examiner* — Dao H Nguyen
(74) *Attorney, Agent, or Firm* — Akona IP PC

(57) ABSTRACT

Embodiments of a microelectronic assembly comprise: a plurality of layers of integrated circuit (IC) dies, each layer coupled to adjacent layers by first interconnects having a pitch of less than 10 micrometers between adjacent first interconnects; an end layer in the plurality of layers proximate to a first side of the plurality of layers comprises a dielectric material around IC dies in the end layer and a through-dielectric via (TDV) in the dielectric material of the end layer; a support structure coupled to the first side of the plurality of layers, the support structure comprising a structurally stiff base with conductive traces proximate to the end layer, the conductive traces coupled to the end layer by second interconnects; and a package substrate coupled to a second side of the plurality of layers, the second side being opposite to the first side.

15 Claims, 6 Drawing Sheets

(51) Int. Cl.

| | |
|---|---|
| *H01L 23/00* | (2006.01) |
| *H01L 23/48* | (2006.01) |
| *H01L 23/498* | (2006.01) |
| *H01L 23/522* | (2006.01) |
| *H01L 25/065* | (2023.01) |

(52) U.S. Cl.
CPC ...... *H01L 23/481* (2013.01); *H01L 23/49811* (2013.01); *H01L 23/49822* (2013.01); *H01L 23/49833* (2013.01); *H01L 23/49838* (2013.01); *H01L 23/5226* (2013.01); *H01L 23/5283* (2013.01); *H01L 24/05* (2013.01); *H01L 24/08* (2013.01); *H01L 24/16* (2013.01); *H01L 24/80* (2013.01); *H01L 25/0652* (2013.01); *H01L 2224/05647* (2013.01); *H01L 2224/05687* (2013.01); *H01L 2224/08121* (2013.01); *H01L 2224/08145* (2013.01); *H01L 2224/08225* (2013.01); *H01L 2224/16225* (2013.01); *H01L 2224/80895* (2013.01); *H01L 2224/80896* (2013.01); *H01L 2924/3512* (2013.01); *H01L 2924/37001* (2013.01); *H01L 2924/3841* (2013.01)

(58) Field of Classification Search
CPC ......... H01L 23/49833; H01L 23/49838; H01L 23/5226; H01L 23/5283; H01L 23/5389; H01L 21/4853; H01L 21/4857; H01L 24/05; H01L 24/08; H01L 24/16; H01L 24/80; H01L 25/0652; H01L 25/0657; H01L 25/18; H01L 2224/08145; H01L 2225/06541

See application file for complete search history.

(56) References Cited

U.S. PATENT DOCUMENTS

| | | | | |
|---|---|---|---|---|
| 2017/0207197 | A1 * | 7/2017 | Yu | H01L 24/92 |
| 2019/0385977 | A1 * | 12/2019 | Elsherbini | H01L 24/14 |
| 2020/0212020 | A1 * | 7/2020 | Zhang | H01L 23/528 |
| 2024/0030152 | A1 * | 1/2024 | Lin | H03K 19/0016 |
| 2025/0006704 | A1 * | 1/2025 | Zhou | H01L 25/0657 |
| 2025/0087632 | A1 * | 3/2025 | Chou | H01L 25/0657 |
| 2025/0226292 | A1 * | 7/2025 | Yang | H10D 30/6735 |

OTHER PUBLICATIONS

U.S. Appl. No. 17/891,880, filed Aug. 19, 2022.
U.S. Appl. No. 17/891,530, filed Aug. 19, 2022.
U.S. Appl. No. 17/891,536, filed Aug. 19, 2022.
U.S. Appl. No. 17/891,704, filed Aug. 19, 2022.
U.S. Appl. No. 17/891,727, filed Aug. 19, 2022.
U.S. Appl. No. 17/891,735, filed Aug. 19, 2022.
U.S. Appl. No. 17/891,666, filed Aug. 19, 2022.
U.S. Appl. No. 17/891,690, filed Aug. 19, 2022.
U.S. Appl. No. 17/891,738, filed Aug. 19, 2022.
U.S. Appl. No. 17/891,560, filed Aug. 19, 2022.
U.S. Appl. No. 17/891,530, filed Aug. 19, 2022, Adel A. Elsherbini.
U.S. Appl. No. 17/891,536, filed Aug. 19, 2022, Adel A. Elsherbini.
U.S. Appl. No. 17/891,560, filed Aug. 19, 2022, Adel A. Elsherbini.
U.S. Appl. No. 17/891,654, filed Aug. 19, 2022, Adel A. Elsherbini.
U.S. Appl. No. 17/891,666, filed Aug. 19, 2022, Adel A. Elsherbini.
U.S. Appl. No. 17/891,690, filed Aug. 19, 2022, Adel A. Elsherbini.
U.S. Appl. No. 17/891,704, filed Aug. 19, 2022, Adel A. Elsherbini.
U.S. Appl. No. 17/891,727, filed Aug. 19, 2022, Adel A. Elsherbini.
U.S. Appl. No. 17/891,735, filed Aug. 19, 2022, Adel A. Elsherbini.
U.S. Appl. No. 17/891,738, filed Aug. 19, 2022, Adel A. Elsherbini.
U.S. Appl. No. 17/891,880, filed Aug. 19, 2022, Adel A. Elsherbini.

* cited by examiner

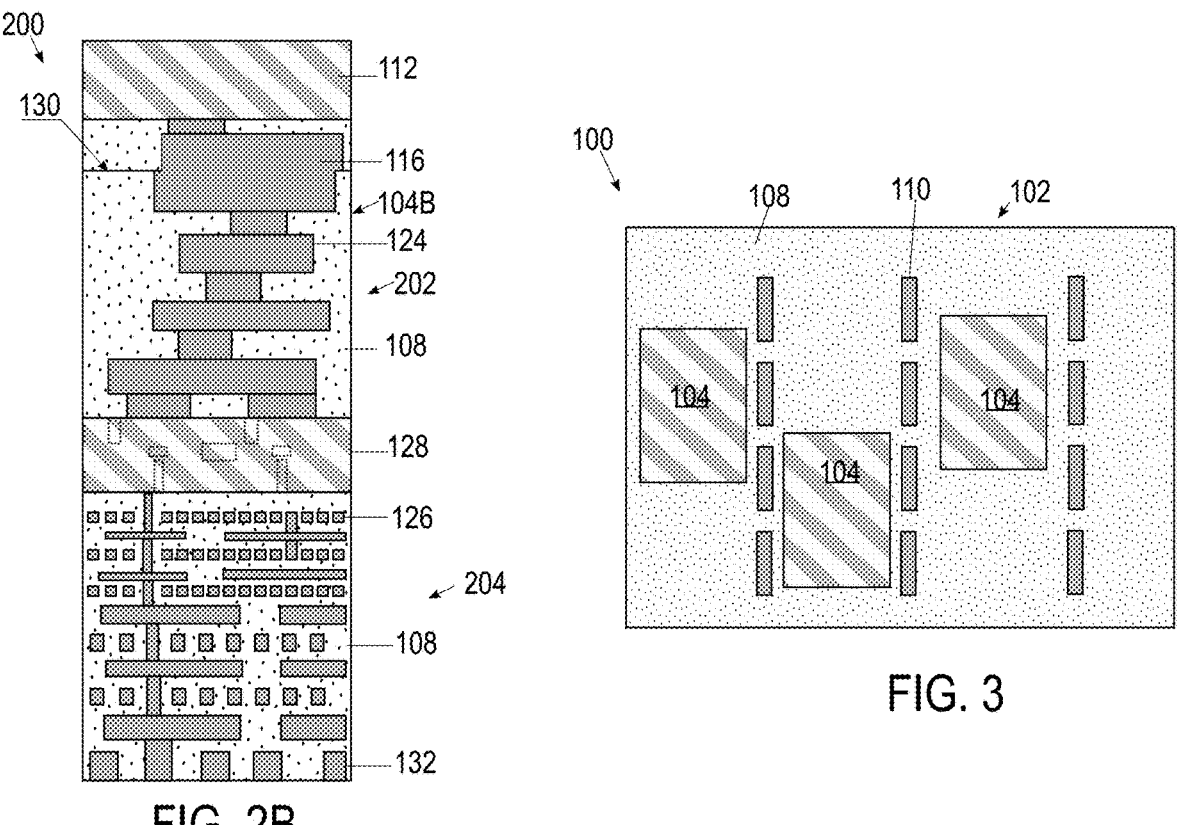
FIG. 2B
FIG. 3
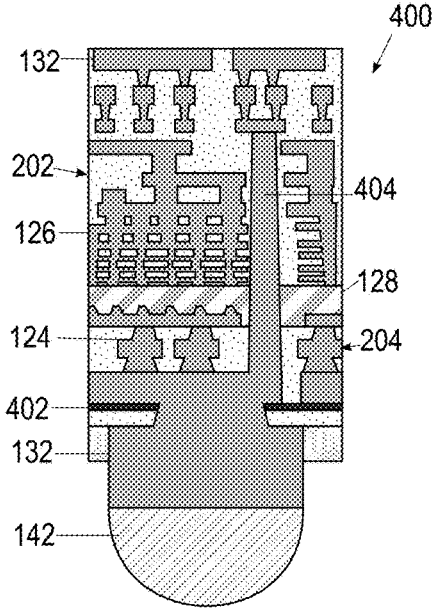
FIG. 4

PROVIDE RECONSTITUTED WAFER OF IC DIES — 602

FORM INTERFACE LAYER ON RECONSTITUTED WAFER — 604

COUPLE ADDITIONAL RECONSTITUTED WAFER TO INTERFACE LAYER — 606

FORM PLURALITY OF LAYERS OF IC DIES — 608

COUPLE SUPPORT STRUCTURE TO TOPMOST LAYER — 610

PACKAGE ARCHITECTURE FOR QUASI-MONOLITHIC CHIP WITH BACKSIDE POWER

TECHNICAL FIELD

The present disclosure relates to techniques, methods, and apparatus directed to a package architecture for quasi-monolithic chip with backside power.

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 2B is a schematic cross-sectional view of a portion of the example microelectronic assembly of FIG. 2A.

FIG. 3 is a schematic top view of a portion of yet another example microelectronic assembly according to some embodiments of the present disclosure.

FIG. 4 is a schematic cross-sectional view of a portion of another example microelectronic assembly according to some embodiments of the present disclosure.

DETAILED DESCRIPTION

Overview

Figures 1A, 1B, 2A:
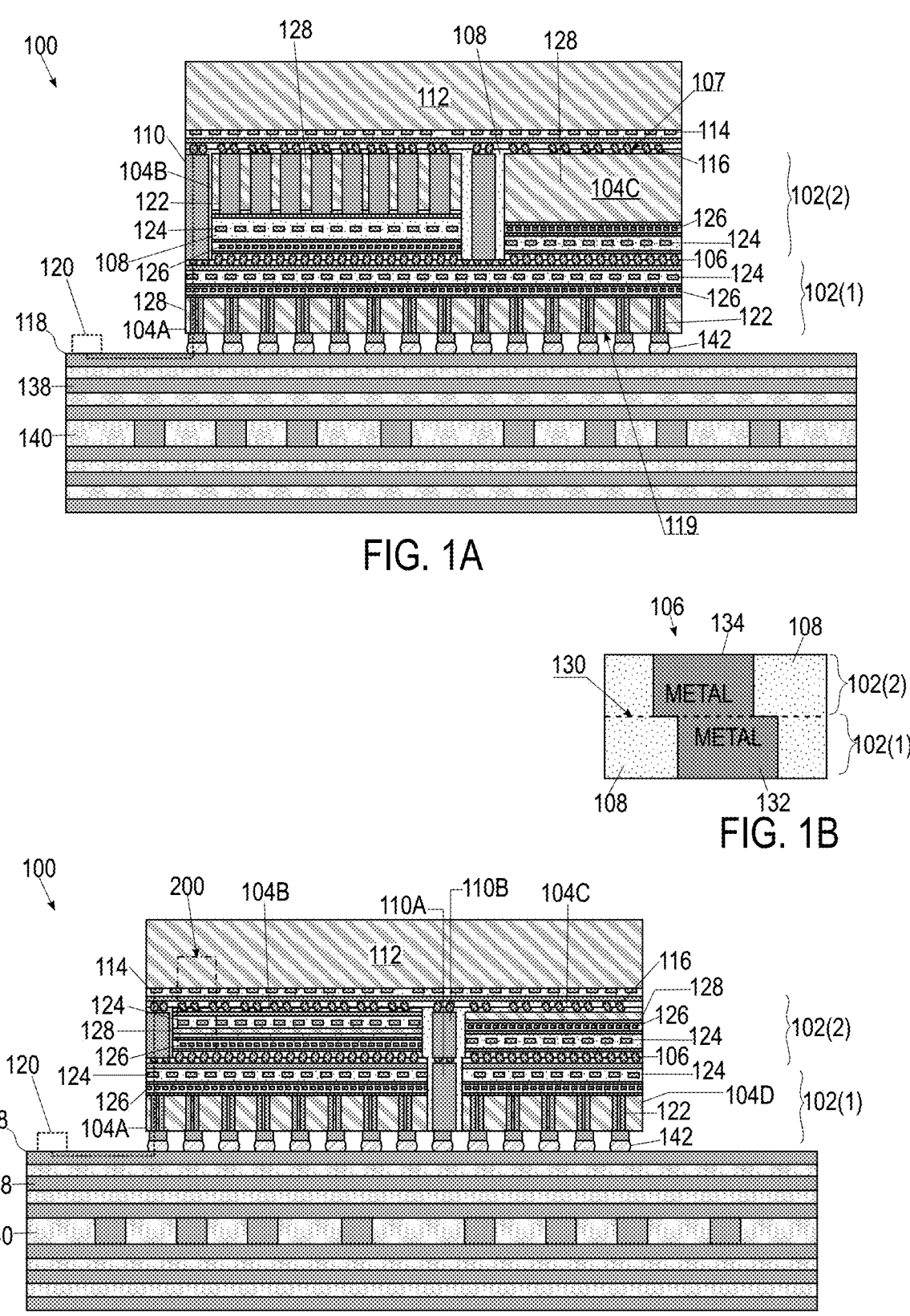
FIG. 1A is a schematic cross-sectional view of an example microelectronic assembly according to some embodiments of the present disclosure.
FIG. 1B is a schematic cross-sectional view of a portion of the example microelectronic assembly of FIG. 1A.
FIG. 2A is a schematic cross-sectional view of another example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

Advances in semiconductor processing and logic design have permitted an increase in the amount of logic circuits that may be included in processors and other IC devices. As a result, many processors now have multiple cores that are monolithically integrated on a single die. Generally, these types of monolithic ICs are also described as planar since they take the form of a flat surface and are typically built on a single silicon wafer made from a monocrystalline silicon boule. The typical manufacturing process for such monolithic ICs is called a planar process, allowing photolithography, etching, heat diffusion, oxidation, and other such processes to occur on the surface of the wafer, such that active circuit elements (e.g., transistors and diodes) are formed on the planar surface of the silicon wafer.

Current technologies permit hundreds and thousands of such active circuit elements to be formed on a single die so that numerous logic circuits may be enabled thereon. In such monolithic dies, the manufacturing process must be optimized for all the circuits equally, resulting in trade-offs between different circuits. In addition, because of the limitation of having to place circuits on a planar surface, some circuits are farther apart from some others, resulting in decreased performance such as longer delays. The manufacturing yield may also be severely impacted because the entire die may have to be discarded if even one circuit is malfunctional.

One solution to overcome such negative impacts of monolithic dies is to disaggregate the circuits into smaller dies (e.g., chiplets. tiles) electrically coupled by interconnect bridges. The smaller dies are part of an assembly of interconnected dies that together form a complete IC in terms of application and/or functionality, such as a memory chip, microprocessor, microcontroller, commodity IC (e.g., chip used for repetitive processing routines, simple tasks, application specific IC, etc.), and system-on-a-chip (SoC). In other words, the individual dies are connected to create the functionalities of a monolithic IC. By using separate dies, each individual die can be designed and manufactured optimally for a particular functionality. For example, a processor core that contains logic circuits might aim for performance, and thus might require a very speed-optimized layout. This has different manufacturing requirements compared to a USB controller, which is built to meet certain universal serial bus (USB) standards, rather than for processing speed. Thus, by having different parts of the overall design separated into different dies, each one optimized in terms of design and manufacturing, the overall yield and cost of the combined die solution may be improved.

The connectivity between these dies is achievable by many ways. For example, in 2.5D packaging solutions, a silicon interposer and through-silicon vias (TSVs) connect dies at silicon interconnect speed in a minimal footprint. In another example, a silicon bridge embedded under the edges of two interconnecting dies facilitates electrical coupling between them. In a three-dimensional (3D) architecture, the dies are stacked one above the other, creating a smaller footprint overall. Typically, the electrical connectivity and mechanical coupling in such 3D architecture is achieved using TSVs and high pitch solder-based bumps (e.g., C2 interconnections). The bridge and the 3D stacked architecture may also be combined to allow for top-packaged chips to communicate with other chips horizontally using the bridge and vertically, using Through-Mold Vias (TMVs) which are typically larger than TSVs. However, these current interconnect technologies use solder or its equivalent for connectivity, with consequent low vertical and horizontal interconnect density.

One way to mitigate low vertical interconnect density is to use an interposer, which improves vertical interconnect density but suffers from low lateral interconnect density if the base wafer of the interposer is passive. In a general sense, an "interposer" is commonly used to refer to a base piece of silicon that interconnects two dies. By including active circuit elements in the interposer, lateral speeds may be improved, but it requires more expensive manufacturing processes, in particular when a large base die is used to interconnect smaller dies. Additionally, not all interfaces require fine pitch connections which may lead to additional manufacturing and processing overheads without the benefits of the fine pitch.

Further, using traditional single sided metallization stacks on silicon wafers results in routing congestion and power deliver limitation. Using double-sided metallization stacks (e.g., metallization stacks on both sides of substrates of IC dies) may mitigate this problem. In an example of a double-sided architecture, thick power distribution conductive traces are disposed on the side of the IC die facing the package or the interposer and thin conductive traces used for signal routing are disposed on the backside of the die. Such double-sided IC dies may be advantageously used with quasi-monolithic hierarchically integrated packaging architecture to offer improved power delivery and logic density. The quasi-monolithic hierarchically integrated packaging architecture includes recursively coupled plurality of IC dies in microelectronic assemblies of a processing system. The plurality of IC dies may comprise active dies and/or passive dies, and at least a portion of the plurality of dies are coupled using high-density interconnects.

Accordingly, embodiments of a microelectronic assembly disclosed herein comprise a plurality of layers of IC dies, each layer coupled to adjacent layers by first interconnects having a pitch of less than 10 micrometers between adjacent first interconnects; an end layer in the plurality of layers proximate to a first side of the plurality of layers comprises a dielectric material around IC dies in the end layer and a through-dielectric via (TDV) in the dielectric material of the end layer; a support structure coupled to the first side of the plurality of layers, the support structure comprising a structurally stiff base with conductive traces proximate to the end layer, the conductive traces coupled to the end layer by second interconnects; and a package substrate coupled to a second side of the plurality of layers, the second side being opposite to the first side.

The quasi-monolithic packaging architecture using double metallization stacks in IC dies as in the embodiments described herein can enable high interconnect density between different layers in stacked dies while maintaining good power distribution, enabling scalable high-density connections between active IC dies without power delivery compromises. The architecture is also scalable to future arrangements where smaller IC dies are used in such microelectronic assemblies.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type or P-type materials. Dies may include, for example, a crystalline base material formed using a bulk silicon (or other bulk semiconductor material) or a silicon-on-insulator (SOI) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., MOSFETs. In many embodiments, an FET is a four-terminal device. In silicon-on-insulator, or nanoribbon, or gate all-around (GAA) FET, the FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides, including optical fiber, optical splitters, optical combiners, optical couplers, and optical vias.

The term "waveguide" refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8 wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing. Waveguides formed in situ may have lower loss characteristics.

The term "conductive trace" may be used to describe an electrically conductive element isolated by an insulating material. Within IC dies, such insulating material comprises interlayer low-k dielectric that is provided within the IC die. Within package substrates, and printed circuit boards (PCBs) such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substrate, the term "interconnect" may also refer to, respectively, die-to-die (DTD) interconnects and die-to-package substrate (DTPS) interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond-pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112*a*-112*e*), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1A is a schematic cross-sectional view of an example microelectronic assembly 100 (plural "microelectronic assemblies 100") according to some embodiments of the present disclosure. Microelectronic assembly 100 comprises a plurality of layers 102 (e.g., 102(1), 102(2)) of IC dies 104 (e.g., 104A, 104B, 104C), each layer 102 coupled to adjacent layers 102 by interconnects 106. In various embodiments, interconnects 106 may be FLI with a pitch of less than 10 micrometers between adjacent interconnects. An example of interconnect 106 in some embodiments is a hybrid bond, comprising metal-metal and dielectric-dielectric bonds. In the example shown in the figure, the number of layers 102 is two: a first layer 102(1) and a second layer 102(2). In various other embodiments, microelectronic assembly 100 may include two or greater number of layers 102. In some embodiments, each layer 102 may comprise an interface layer (not shown for ease of illustration and so as not to clutter the drawings) on either side, the interface layer comprising the metal material and dielectric material of interconnects 106.

In various embodiments, at least an end layer (e.g., 102(2) in the embodiment shown in the figure) in layers 102, proximate to a side 107 of the plurality of layers 102, may comprise a dielectric material 108 around (e.g., between, surrounding, etc.) IC dies 104. In the example shown, only layer 102(2) has dielectric material 108 around IC dies 104; in other embodiments, both layers 102(1) and 102(2) may have dielectric material 108 around IC dies 104. In other embodiments where there are a greater number of layers 102, dielectric material 108 may be present around IC dies 104 in one or more such layers 102. One or more through-dielectric vias (TDVs) 110 may be present in dielectric material 108 in layers 102. In various embodiments, dielectric material 108 comprises inorganic materials, for example, silicon oxide, silicon nitride, silicon carbide, and/or other forms of inorganic dielectric material typically used as interlayer dielectric (ILD) in semiconductor devices.

A support structure 112 may be coupled to side 107 of the plurality of layers 102. In some embodiments, support structure 112 may comprise a structurally stiff and thermally conductive base, such as silicon or silicon carbide. In various embodiments, support structure 112 may comprise a wafer of silicon cut to suitable proportions to fit over layers 102. Conductive traces 114 may be disposed on support structure 112 proximate to the end layer (e.g., 102(2) in the embodiment shown in the figure) in layers 102. Conductive traces 114 may be coupled to side 107 of the plurality of layers 102 by interconnects 116. In some embodiments, conductive traces 114 may be coupled to the interface layer on side 107. In some embodiments, conductive traces 114 in support structure 112 may be conductively coupled by interconnects 116 to TDV 110 in layers 102, for example, TDV 110 in layer 102(2) of the example embodiment shown. In some embodiments, interconnects 116 may be of the same type and pitch as interconnects 106. In other embodiments, interconnects 116 may have different dimensions and pitch than interconnects 106. A package substrate 118 may be coupled to another side 119 of the plurality of layers 102, side 119 being opposite to side 107.

In various embodiments, conductive traces 114 may comprise a power plane configured to be coupled to one or more power sources. Conductive traces 114 in support structure 112 may be conductively coupled to a power circuit 120. Power circuit 120 may comprise various components such as voltage regulators, capacitors, inductors, power sources, etc. that are not shown in the figure merely for ease of illustration. A person with ordinary skill in the art will understand that power circuit 120 will include conductive pathways between the power sources and one or more active circuit element in microelectronic assembly 100.

In some embodiments (as shown), one or more IC dies 104 (e.g., 104A) in some layers 102 (e.g., 102(1)), may comprise through-substrate vias (TSVs) 122. TSVs 122 may be configured to carry power, signals and/or ground connection between package substrate 118 and IC dies 104 in the plurality of layers 102. For example, a conductive pathway between power circuit 120 and an active circuit element may include TSVs 122 through IC die 104A in layer 102(1), interconnects 106 between layers 102(1) and 102(2), TDV 110 in dielectric material 108 of layer 102(2), interconnects 116 between TDVs 110 and conductive traces 114 of support structure 112, conductive traces 114 in support structure 112, and interconnects 116 between support structure 112 and TSVs 122 in IC die 104B.

In various embodiments, one or more IC die 104 in microelectronic assembly 100 may comprise at least two different kinds of conductive traces: conductive traces 124 configured to carry power and conductive traces 126 configured to carry signals. Note that conductive traces 124 and 126 are shown as disconnected rectangles; such is only for illustrative/schematic purposes and the shapes are not intended to be accurate representations of actual conductive traces in an actual IC die. In addition, conductive vias and other elements are not shown for ease of illustration. Conductive traces 124 may, in general, be larger (e.g., thicker, wider) than conductive traces 126. In some embodiments, the smallest one of conductive traces 124 may be larger than the largest one of conductive traces 126. Conductive traces 124 and 126 may be present in a metallization stack (not labeled with particularity) comprising dielectric material 108. In some embodiments, the material of dielectric material 108 in the metallization stacks may be the same as that of dielectric material 108 around IC dies 104; in other embodiments, the material of dielectric material 108 in the metallization stacks may be different from that of dielectric material 108 around IC dies 104. In some embodiments, conductive traces 124 may be closer to interconnects 106 than conductive traces 126. In other embodiments, conductive traces 126 may be closer to interconnects 106 than conductive traces 124.

In the example embodiment shown in the figure, conductive traces 124 and 126 of all IC dies 104 (e.g., 104A, 104B, 104C) are located on the same side of respective substrates 128. For example, in IC die 104A, TSVs 122 disposed in substrate 128 may conductively couple with conductive traces 126, which are proximate to substrate 128. Conductive traces 124 may be farther from substrate 128 than conductive traces 126 in IC die 104A. The configuration may be similar for IC die 104C. However, for IC die 104B, conductive traces 124 may be closer to substrate 128, for example, to be closer to TSVs 122 therein. In such a configuration (i.e., as in IC die 104B), power may be delivered to active circuit elements of IC die 104B faster (e.g., with less loss or other undesirable aspects) by way of conductive traces 114 in support structure 112 and TSVs 122 directly coupled thereto by interconnects 116.

FIG. 1B is a schematic cross-sectional view of a detail of a particular one of interconnects 106 in microelectronic assembly 100. Note that although only interconnect 106 is shown, the same structure and description may apply to any other such interconnects comprising hybrid bonds in microelectronic assembly 100 where applicable, for example, interconnects 116. In a general sense, interconnect 106 may comprise, at an interface 130 between layers 102(1) and 102(2), metal-metal bonds between bond-pad 132 of layer 102(1) and bond-pad 134 of layer 102(2), and dielectric-dielectric bonds (e.g., oxide-oxide bonds) in dielectric materials 108 of layers 102(1) and 102(2). In some embodiments, the structures as illustrated in the figure may be present in an interface layer between layers 102(1) and 102(2). In other embodiments, the structures as illustrated in the figure may be present in IC dies 104 of the respective layers. In yet other embodiments, some structures as illustrated in the figure may be present in IC dies 104 of one of the layers, and other structures may be present outside/around IC dies 104 of the other one of the layers. Bond-pad 132 of layer 102(1) may bond with bond-pad 134 of layer 102(2). Dielectric material 108 (e.g., silicon oxide, silicon nitride, silicon oxynitride, etc.) in layers 102(1) and 102(2) may bond with each other. The bonded metal and dielectric materials form interconnect 106, comprising hybrid bonds, providing electrical and mechanical coupling between layers 102(1) and 102(2). In various embodiments, interconnects 106 may have a linear dimension of less than 5 micrometers and a pitch of less than 10 micrometers between adjacent interconnects.

Turning back to FIG. 1A, package substrate 118 comprises conductive traces 138 in an organic dielectric material 140. Examples of materials for organic dielectric material 140 are noted in the previous subsection. Note that conductive traces 138 are shown as disconnected rectangles in organic dielectric material 140, such is only for illustrative/schematic purposes and the shapes are not intended to be accurate representations of an actual package substrate. In addition, conductive vias, bond-pads, redistribution layers, substrate cores, passive components and other elements of package substrate 118 are not shown merely for ease of illustration and not as limitations. Package substrate 118 may be coupled to side 119 of plurality of layers 102 by SLIs 142 (e.g., DTPS interconnects, such as flip-chip solder bonds). In various embodiments, SLI 142 may have a pitch greater than 10 micrometers between adjacent interconnects. The example shows a packaging architecture where package substrate 118 is coupled only to a "bottom-side" of the die assembly, including plurality of layers 102 and support structure 112. In other embodiments, a "top-side" of the die assembly may also be coupled to package substrate 118, for example, to improve power delivery from power circuit 120.

In some such embodiments, support structure 112 may include TSVs conductively coupled to bond pads on a side of support structure 112 opposite to plurality of layers 102, and the bond pads may be wirebonded or otherwise conductively coupled to corresponding bond pads on package substrate 118.

The configuration of microelectronic assembly 100 as described herein is a quasi-monolithic package architecture. Support structures in traditional quasi-monolithic package architecture consists of a silicon substrate with no devices or metal traces and the interface to the structural silicon is fusion bonding (i.e., dielectric-dielectric bonds with no metal-metal bonds at the interface). In contrast, in embodiments as described herein, power routing is done on support structure 112 (for example, through conductive traces 114) and interface 130 between support structure 112 and layer 102 immediately adjacent thereto comprises metal-metal and dielectric-dielectric bonds as described in FIG. 18. Further, embodiments as described herein can enable more scalable pitch at any double-sided die interface, as fine pitch signals through conductive traces 126 do not have to go through thick power delivery metal planes of conductive traces 124. Embodiments as described herein can also enable improved resistive (e.g., IR) drop across the double-sided die as power planes in IC dies 104 and support structure 112 operate in tandem to reduce the IR drop. In some embodiments, capacitor layers may be implemented in IC dies 104 of one or more layers, for example, layer 102(1) to further improve power delivery. In other embodiments, capacitors may be disposed in support structure 112. The capacitor layers are generally relatively thin and may not impact the thermal performance significantly. Such architecture as described can enable flexible configuration, for example, allowing for double-sided IC dies without TSVs 122 based on particular needs, permitting improved thermal performance due to less interfaces and lack of a thick silicon substrate.

In some embodiments, the presence of a power delivery layer as embodied in conductive traces 114 may negatively impact thermal performance of support structure 112. Such a problem may nevertheless be mitigated in some embodiments by use of a high metal density power layer, which may be needed for electrical reasons as well, and utilizing high thermal conductivity dielectrics such as silicon nitride or aluminum nitride instead of silicon oxide. In traditional silicon with active circuit elements, these high thermal conductivity dielectrics may not be used for various reasons, such as their high permittivity, which increases parasitics for signal routing. However, in support structure 112, which does not have any active circuit elements or signal routing, merely comprising passive conductive traces 114 (e.g., for power distribution), using such high thermal conductivity dielectrics can be an acceptable technique to enhance thermal performance.

FIG. 2A is a schematic cross-sectional view of another example microelectronic assembly according to some embodiments of the present disclosure. The configuration of the embodiment shown in the figure is like that of FIG. 1A, except for differences as described further. Layer 102(1) may comprise more than one IC die 104, for example, IC dies 104A and 104D, separated by a space in which is disposed TDV 110A. Only one TDV 110A is shown for illustrative purposes; any number of TDVs 110 may be disposed in the spaces between IC dies 104 in any layer 102, including layer 102(1). TDVs 110B may be disposed in layer 102(2). Although not shown in the particular cross-sectional view of the figure, some of TDVs 110B may be coupled to IC die 104A, other TDVs 110B may be coupled to IC die 104D (and/or other IC dies 104 in layer 102(1) not shown in the figure) and yet other TDVs 110B may be coupled to TDVs 110A in layer 102(1). Further, in embodiments where there are more than two layers, TDVs 110 in any one layer 102 may be conductively coupled to TDVs 110 in adjacent layers and to IC dies 104 in adjacent layers by interconnects 106 suitably. In the specific example of the figure, TDVs 110A and 110B are shown coupled by interconnects 106 (e.g., hybrid bonds). In other embodiments, TDV 110A may be formed directly (e.g., by electrodeposition, or other appropriate processes) through one or more layers 102 without additional bond pads between TDVs in adjacent layers. Further, TDVs 110 are larger than bond pads associated therewith in some embodiments. In other embodiments, TDVs 110 may be similar size or smaller than associated bond pads.

In the example embodiment shown in the figure, IC dies 104B and 104C in layer 102(2) may not comprise TSVs 122. Instead, one or more of IC dies 104 in layer 102(2) may be double-sided dies, comprising metallization stacks on opposing sides of substrate 128. For example, in IC die 104B, one metallization stack comprising conductive traces 126 is on a side of substrate 128 proximate to IC die 104A whereas another metallization stack comprising conductive traces 124 is on the opposing side of substrate 128 proximate to support structure 112. Conductive traces 124 may be coupled by conductive vias (not shown so as not to clutter the drawing) to interconnects 116 between layer 102(2) and support structure 112. In such a configuration (e.g., as in IC die 104B), power from conductive traces 114 in support structure 112 may be delivered to active circuit elements in substrate 128 of IC die 104B through conductive traces 124 by way of conductive vias (not shown) coupling conductive traces 124 with interconnects 116 that are coupled to conductive traces 114. Conductive traces 126 in IC die 104B configured to carry signals may be coupled to interconnects 106 between layers 102(2) and 102(1) by way of conductive vias (not shown so as not to clutter the drawing).

On the other hand, IC die 104C may not comprise TSVs 122, nor is it a double-sided die. In such a configuration (e.g., as in IC die 104C), power may be delivered from power circuit 120 to active circuit elements in substrate 128 of IC die 104C through SLIs 142, TSVs 122 in IC die 104D, conductive traces 124 in IC die 104D, interconnects 106 between IC dies 104C and 104D, and conductive traces 124 in IC die 104C. In some embodiments, power may be delivered to IC die 104C from package substrate 118; in other embodiments, power may be delivered to IC die 104C from conductive traces 114 in support structure 112 by way of TDVs 110B, and therethrough to conductive traces 124 in IC die 104D and interconnects 106 between IC die 104D and 104C.

FIG. 2B is a schematic cross-sectional view of a portion 200 of microelectronic assembly 100 showing a double-sided die, for example IC die 104B in the embodiment of FIG. 2A. Support structure 112 may be coupled to IC die 104B by interconnects 116 at interface 130. A metallization stack 202 proximate to interface 130 with support structure 112 may comprise conductive traces 124 (and conductive vias not labeled with particularity) in separate layers of dielectric material 108. Metallization stack 202 may be on one side of substrate 128; another metallization stack 204 may be disposed on an opposing side of substrate 128. Metallization stack 204 comprises conductive traces 126 (and conductive vias not labeled with particularity) in separate layers of dielectric material 108. Bond-pads 132 in metallization stack 204 may facilitate forming interconnects 106 with other layers 102 (e.g., 102(1)). Active circuit elements (not labeled with particularity) may be disposed in substrate 128. Conductive traces 124 and conductive traces 126 may differ in size (e.g., thickness, width); for example, conductive traces 124 may be larger than the largest of conductive traces 126.

FIG. 3 is a schematic top view of an example microelectronic assembly 100 showing TDVs 110 disposed in dielectric material 108 in any layer 102. In some embodiments, TDVs 110 may comprise trench vias (e.g., not circular in cross-section), arranged in rows between IC dies 104 in layer 102. In some embodiments (not shown), TDVs 110 may extend along an entire length (or width) and thickness of corresponding layer 102. In some embodiments (not shown), TDVs 110 may comprise continuous trench vias along an entire length (or width) and thickness of corresponding layer 102 without any breaks. In the example shown, only one of IC dies 104 is shown between any two adjacent rows of TDVs 110 merely for ease of illustration. Any number of IC dies 104 may be disposed between adjacent rows of TDVs 110 within the broad scope of the embodiments.

FIG. 4 is a schematic cross-sectional view of a portion 400 of another example microelectronic assembly 100 according to some embodiments of the present disclosure. Portion 400 may represent a portion of IC die 104D of FIG. 2A, for example. Conductive traces 126 may be disposed in metallization stack 202 on one side of substrate 128. Conductive traces 124 may be disposed in separate layers in metallization stack 204 on a side of substrate 128 opposite to metallization stack 202. Capacitors 402 (e.g., trench capacitors, metal insulator metal (MIM) capacitors, etc.) may be disposed in metallization stack 204 (and/or 202), for example, depending on the capacitance values needed. Bond-pads 132 in metallization stack 204 may be configured to bond with SLIs 142 in some embodiments. In other embodiments (not shown) bond-pads 132 may be configured to attach to bond-pads 134 of other layers 102. Note that although conductive traces 126 are shown connected in metallization stack 202, such is only an artifact of an imperfect rendering of a highly complex physical structure; in actual IC dies, conductive traces and vias are separated appropriately so as not to create shorts. In some embodiments, a conductive via 404 may provide a conductive pathway between bond-pads 132 on one side of metallization stack 202 distant from substrate 128 and bond-pads 132 on an opposing side of metallization stack 204. In some embodiments, conductive via 404 may conductively couple conductive traces 124 and conductive traces 126 on either side of substrate 128. In some embodiments, conductive via 404 may be formed from a stack of vias in metallization stacks 202 and 204 and conductively coupled through substrate 128. As described in reference to previous figures, conductive traces 124 may be larger than the largest one of conductive traces 126.

Figures 5, 6:
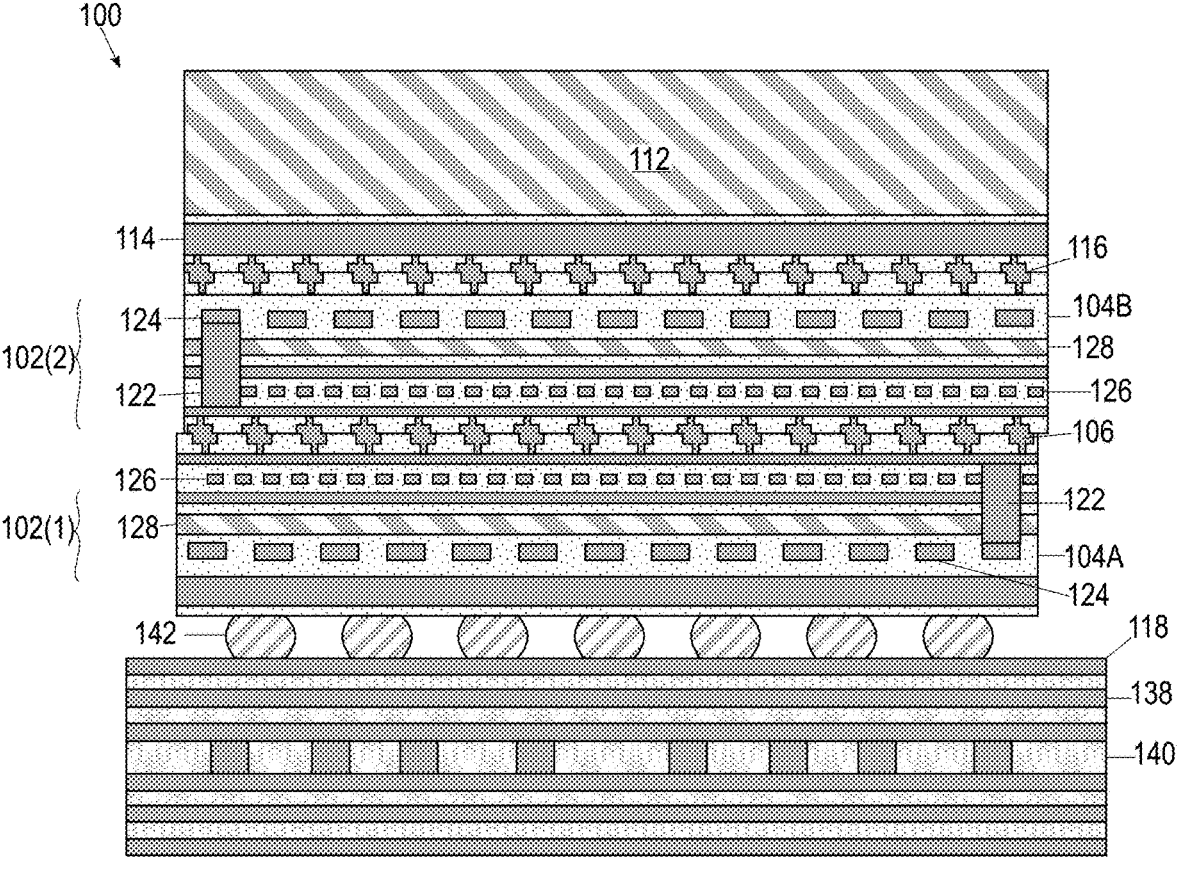
FIG. 5 is a schematic cross-sectional view of another example microelectronic assembly according to some embodiments of the present disclosure.
FIG. 6 is a schematic flow diagram listing example operations that may be associated with fabricating a microelectronic assembly according to some embodiments of the present disclosure.

FIG. 5 is a schematic cross-sectional view of another example microelectronic assembly 100 according to some embodiments of the present disclosure. IC die 104A in layer 102(1) may be coupled to package substrate 118 by SLIs 142. TSVs 122 through substrate 128 may conductively couple conductive traces 124 on one side of substrate 128 with conductive traces 126 on an opposing side of substrate 128. IC die 104A may be coupled to IC die 104B in layer 102(2) by interconnects 106. TSVs 122 may couple conductive traces 126 in IC die 104B with conductive traces 124 on an opposing side of substrate 128 in IC die 104B.

Conductive traces 124 may be conductively coupled to conductive traces 114 in support structure 112.

In embodiments where IC dies 104A and/or 104B are relatively large, having power connections only around die edges through TDVs 110 may not yield the desired performance (for example, as the number of TDVs 110 may be limited by the relatively large size of IC dies 104). In some embodiments, kerf etch and plasma dicing operations may be used to create slotted trenches within IC dies 104 that may be filled with copper to form TSVs 122, for example, to enable improved power distribution to the backside of the double-sided IC dies 104. The trenches can be placed in local arrays to increase the power delivered from SLIs 142 below. Examples of such arrays may include 2×1, 2×2, 4×1, 3×1 arrays (e.g., constrained by solder bump footprint of SLI 142 and other considerations beyond the scope of the present disclosure). In some embodiments, IC dies 104 in layer 102(1) (or any layer lower than another layer), may be a double-sided IC die with conductive traces 124 facing package substrate 118 and conductive traces 126 available on the opposing side of substrate 128. In such embodiments, support structure 112 may be leveraged for thermal dissipation, for example, where support structure 112 is thicker than 10 micrometers. In some embodiments, dense interconnect structures comprising closely packed conductive traces 126 can be built up directly on one or the other metallization stacks of IC dies 104. In either case, power may be delivered to upper layers 102 through TSVs 122 or pass through TDVs 110 around IC dies 104. In some embodiments, TDVs 110 may be larger than TSVs 122.

In various embodiments, any of the features discussed with reference to any of FIGS. 1-5 herein may be combined with any other features to form a package with one or more IC dies as described herein, for example, to form a modified IC die 104 or a modified microelectronic assembly 100. Some such combinations are described above, but, in various embodiments, further combinations and modifications are possible. Further, the various embodiments described in any of FIGS. 1-5 herein may be combined suitably based on particular needs within the broad scope of the embodiments. For example, microelectronic assembly 100 may include IC dies 104 having TSVs 122, and other IC dies having a double-sided configuration.

Example Methods

FIG. 6 is a schematic flow diagram illustrating example operations 600 that may be associated with embodiments of methods to fabricate microelectronic assembly 100. At 602, a reconstituted wafer (e.g., corresponding to layer 102(1)) may be provided, the reconstituted wafer comprising a plurality of IC dies 104 (e.g., 104A). IC dies 104 may be known good dies, that is, they have passed various tests for functionality, etc. and are known to be functional. In some embodiments, the reconstituted wafer may comprise TDVs 110 around IC dies 104. In some embodiments, the reconstituted wafer may be formed by a process comprising: coupling known good IC dies 104 to a carrier, forming copper pillars around IC dies 104, depositing dielectric material 108 around the copper pillars and IC dies 104 and removing the carrier. In other embodiments, the reconstituted wafer may be formed by a process comprising: coupling known good IC dies 104 to a carrier, depositing dielectric material 108 around IC dies 104, forming vias in dielectric material 108, depositing conductive material (e.g., copper) in dielectric material 108 to form TDVs 110, and removing the carrier. At 604, an interface layer comprising bond-pads 132 and dielectric material 108 may be formed over the reconstituted wafer. In some embodiments, the interface layer may be part of the reconstituted wafer, in which case, operations at 604 may be dispensed with.

At 606, an additional reconstituted wafer (e.g., corresponding to layer 102(2)) may be coupled to the interface layer. The additional reconstituted wafer comprises another plurality of IC dies 104 (e.g., 104B, 104C) and TDVs 110 in dielectric material 108 around IC dies 104. IC dies 104 may be known good dies, that is, they have passed various tests for functionality, etc. and are known to be functional. The additional reconstituted wafer may be formed by processes as described above in reference to operation 602. Coupling the additional reconstituted wafer to the interface layer may comprise forming interconnects 106 (e.g., metal-metal bonds and dielectric-dielectric bonds) at the interface layer, the structure as described in reference to FIG. 18. At 608, the steps of forming the interface layer and coupling the additional reconstituted wafer may be repeated until a desired stack of IC dies having a plurality of layers 102 in the stack is obtained. At 610, support structure 112 may be coupled to the end layer (e.g., topmost layer) in the plurality of layers 102. Support structure 112, as described in previous figures, may comprise conductive traces 114 constituting a power plane. In various embodiments, coupling support structure 112 to the end layer comprises forming interconnects 116 (e.g., metal-metal bonds and dielectric-dielectric bonds) with the end layer. In some embodiments, forming interconnects 116 may comprise forming another interface layer over the end layer, forming the power plane over such interface layer, and depositing a layer of silicon oxide over the power plane.

Although FIG. 6 illustrates various operations performed in a particular order, this is simply illustrative and the operations discussed herein may be reordered and/or repeated as suitable. Further, additional processes which are not illustrated may also be performed without departing from the scope of the present disclosure. Also, various ones of the operations discussed herein with respect to FIG. 6 may be modified in accordance with the present disclosure to fabricate others of microelectronic package 100 disclosed herein. Although various operations are illustrated in FIG. 6 once each, the operations may be repeated as often as desired. For example, one or more operations may be performed in parallel to manufacture and test multiple microelectronic packages substantially simultaneously. In another example, the operations may be performed in a different order to reflect the structure of a particular microelectronic package in which one or more substrates or other components as described herein may be included.

Furthermore, the operations illustrated in FIG. 6 may be combined or may include more details than described. For example, the operations may be modified suitably without departing from the scope of the disclosure for IC dies that do not have a semiconductor substrate, but rather, are fabricated on other materials, such as glass or ceramic materials. Still further, the various operations shown and described may further include other manufacturing operations related to fabrication of other components of the microelectronic assemblies described herein, or any devices that may include the microelectronic assemblies as described herein. For example, the operations not shown in FIG. 6 may include various cleaning operations, additional surface planarization operations, operations for surface roughening, operations to include barrier and/or adhesion layers as desired, and/or operations for incorporating microelectronic packages as described herein in, or with, an IC component, a computing device, or any desired structure or device.

Example Devices and Components

Figure 7:
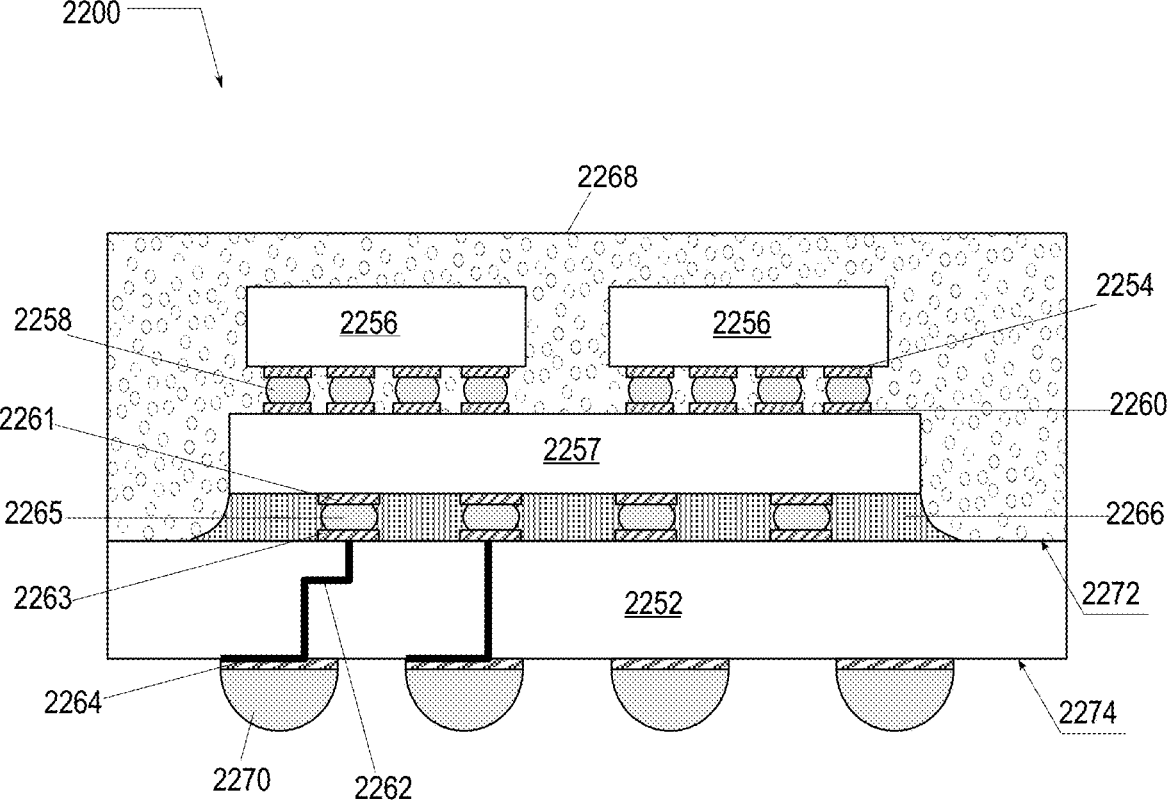
FIG. 7 is a cross-sectional view of a device package that includes one or more microelectronic assemblies in accordance with any of the embodiments disclosed herein.
Figure 8:
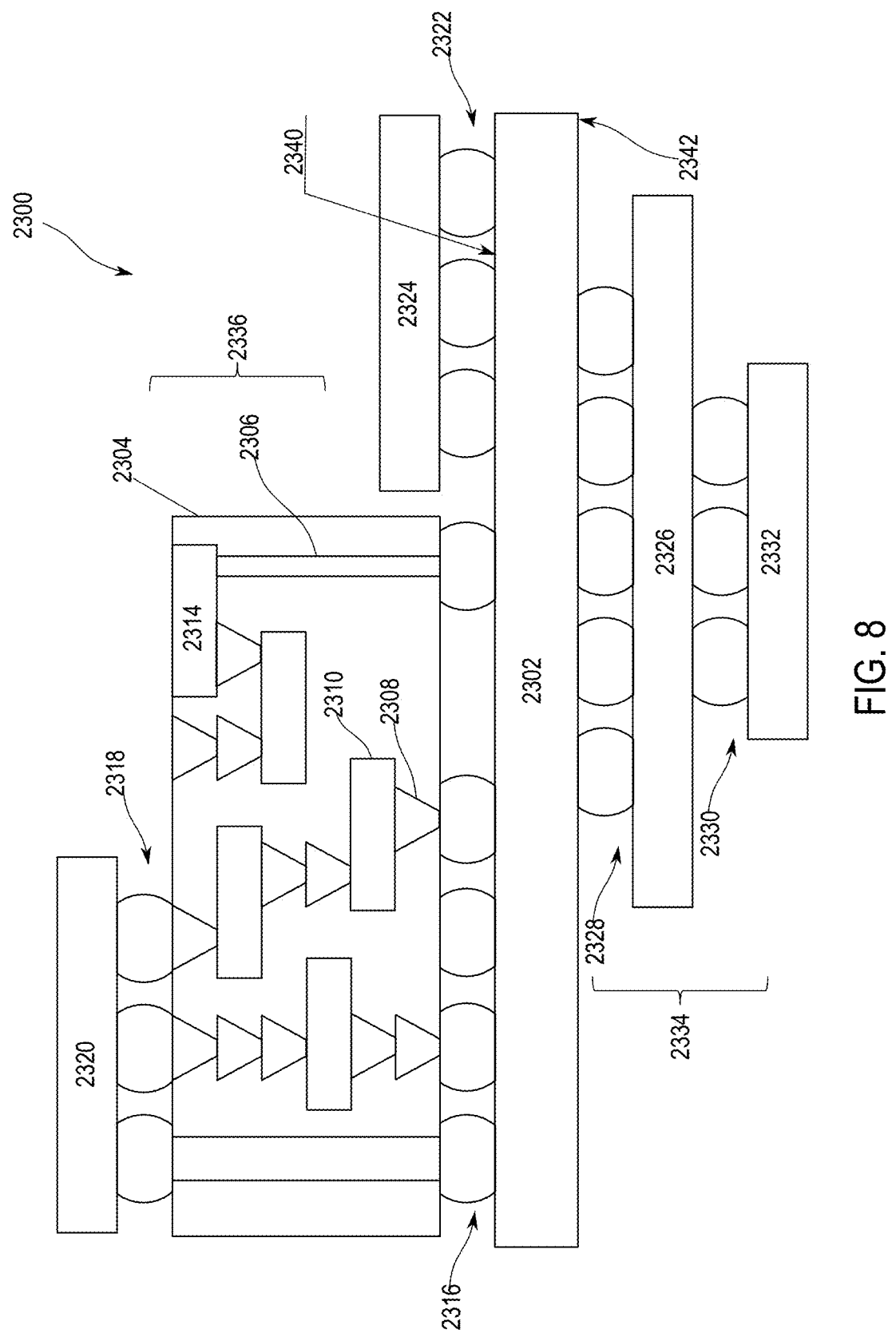
FIG. 8 is a cross-sectional side view of a device assembly that includes one or more microelectronic assemblies in accordance with any of the embodiments disclosed herein.
Figure 9:
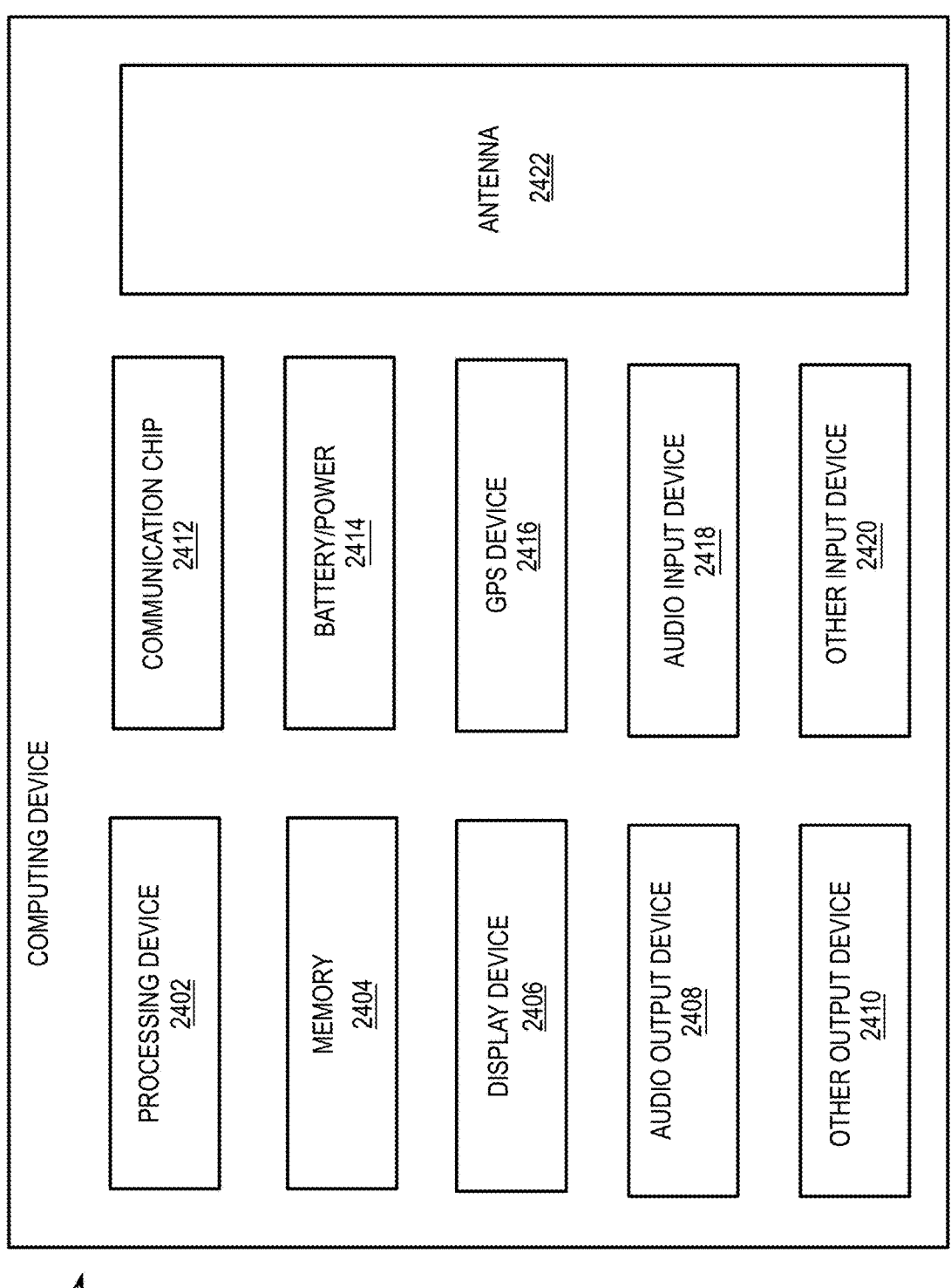
FIG. 9 is a block diagram of an example computing device that includes one or more microelectronic assemblies in accordance with any of the embodiments disclosed herein.

The packages disclosed herein, e.g., any of the embodiments shown in FIGS. 1-6 or any further embodiments described herein, may be included in any suitable electronic component. FIGS. 7-9 illustrate various examples of packages, assemblies, and devices that may be used with or include any of the IC packages as disclosed herein.

FIG. 7 is a side, cross-sectional view of an example IC package 2200 that may include IC packages in accordance with any of the embodiments disclosed herein. In some embodiments, the IC package 2200 may be a SiP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 8.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., HBM), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 8 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 7.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-oninterposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 7. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 9 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 7). In yet another example, any one or more of the components of computing device 2400 may include an IC device assembly 2300 (e.g., as shown in FIG. 8).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SoC die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, crypto-processors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

Select Examples

Example 1 provides a microelectronic assembly (e.g., 100, FIG. 1A), comprising: a plurality of layers (e.g., 102) of integrated circuit (IC) dies (e.g., 104), each layer coupled to adjacent layers by first interconnects (e.g., 106) having a pitch of less than 10 micrometers between adjacent first interconnects, in which an end layer (e.g., 102(2)) in the plurality of layers is proximate to a first side (e.g., 107) of the plurality of layers; a support structure (e.g., 112) coupled to the first side of the plurality of layers, the support structure comprising a structurally stiff base with conductive traces (e.g., 114) proximate to the end layer, the conductive traces coupled to the end layer by second interconnects (e.g., 116) having a pitch of less than 10 micrometers between adjacent second interconnects; and a package substrate (e.g., 118) coupled to a second side (e.g., 119) of the plurality of layers, the second side being opposite to the first side, in which: the end layer comprises a dielectric material (e.g., 108) around IC dies in the end layer and a through-dielectric via (TDV)

(e.g., 110) in the dielectric material of the end layer, the conductive traces in the support structure are coupled by the second interconnects to the TDV in the end layer, and the conductive traces in the support structure are conductively coupled to a power circuit (e.g., 120).

Example 2 provides the microelectronic assembly of example 1, in which the structurally stiff base comprises a thermally conductive material.

Example 3 provides the microelectronic assembly of example 2, in which the thermally conductive material comprises silicon.

Example 4 provides the microelectronic assembly of any one of examples 1-3, in which: the end layer is a first end layer (e.g., 102(2)), and IC dies (e.g., 104A) in a second end layer (e.g., 102(1)) proximate to the second side of the plurality of layers comprises through-substrate vias (TSVs) (e.g., 122).

Example 5 provides the microelectronic assembly of any one of examples 1-3, in which (e.g., FIG. 2A): the end layer is a first end layer, the TDV in the first end layer is a first TDV, the plurality of layers comprises a second end layer (e.g., 102(2)) proximate to the second side of the plurality of layers, the second end layer comprises the dielectric material around the IC dies in the second end layer, the second end layer comprises a second TDV (e.g., 110B) in the dielectric material, and the second TDV is conductively coupled to the first TDV (e.g., 110A) in the first end layer.

Example 6 provides the microelectronic assembly of example 5, in which: the plurality of layers contains the first end layer and the second end layer, and the first TDV and the second TDV are coupled by the first interconnects.

Example 7 provides the microelectronic assembly of any one of examples 5-6, further comprising a plurality of first TDVs in the first end layer and another plurality of second TDVs in the second end layer, in which at least some of the first TDVs are conductively coupled to at least some of the second TDVs.

Example 8 provides the microelectronic assembly of any one of examples 1-7, further comprising: a first type of conductive traces (e.g., 124); and a second type of conductive traces (e.g., 126), in which: the first type of conductive traces is larger than the second type of conductive traces, the first type of conductive traces is configured to carry power and is conductively coupled to the power circuit, and the second type of conductive traces is configured to conduct electrical signals and is not conductively coupled to the power circuit.

Example 9 provides the microelectronic assembly of example 8, in which the conductive traces in the support structure are of the first type.

Example 10 provides the microelectronic assembly of any one of examples 8-9, in which: the IC dies comprise respective substrates (e.g., 128) attached to respective metallization stacks, and the respective metallization stacks include the dielectric material, the first type of conductive traces, and the second type of conductive traces.

Example 11 provides the microelectronic assembly of example 10, in which at least a portion of the first type of conductive traces in the IC dies is coupled to the conductive traces in the support structure.

Example 12 provides the microelectronic assembly of any one of examples 10-11, in which (e.g., FIG. 4) the IC dies further comprise trench capacitors (e.g., 402) in the respective substrates.

Example 13 provides the microelectronic assembly of any one of examples 10-12, in which: the respective metallization stack in at least one IC die (e.g., 104B) in the end layer is on one side of the respective substrate, and the first type of conductive traces and the second type of conductive traces are in correspondingly separate layers within the respective metallization stack.

Example 14 provides the microelectronic assembly of example 13, in which (e.g., FIG. 1A): the at least one IC die (e.g., 104B) in the end layer comprises TSVs (e.g., 122) in the respective substrate, each TSV has a first end proximate to the first interconnects, and a second end distant from the first interconnects, the second end being proximate to the one side of the respective substrate, the first end is coupled to the conductive traces in the support structure by the first interconnects, and the second end is coupled to the first type of conductive traces in the respective metallization stack of the at least one IC die.

Example 15 provides the microelectronic assembly of example 10, in which (e.g., FIG. 2A, 2B, 4): at least one IC die (e.g., 104B) in the end layer comprises a first metallization stack (e.g., 202) on one side of the respective substrate and a second metallization stack (e.g., 204) on an opposing side of the respective substrate, the first type of conductive traces is in the first metallization stack, and the second type of conductive traces is in the second metallization stack, and the first type of conductive traces is coupled to the conductive structures in the support structure by the first interconnects.

Example 16 provides the microelectronic assembly of any example 10, in which (e.g., FIG. 5) the IC die further comprises TSVs through the respective substrate conductively coupling the first type of conductive traces and the second type of conductive traces.

Example 17 provides the microelectronic assembly of any one of examples 10, 15, or 16, in which (e.g., FIG. 4) at least one IC die in the plurality of IC dies further comprises a conductive via (e.g., 404) conductively coupling two opposing sides of the at least one IC die.

Example 18 provides the microelectronic assembly of any one of examples 10-17, in which (e.g., FIG. 4): at least one IC die in the plurality of IC dies further comprises two metallization stacks separated by a respective substrate (e.g., 128), and respective conductive traces in the two metallization stacks are of different sizes.

Example 19 provides the microelectronic assembly of any one of examples 10-18, in which (e.g., FIG. 4) the at least one IC die further comprises capacitors (e.g., 402).

Example 20 provides the microelectronic assembly of any one of examples 1-19, in which (e.g., FIG. 1B): the first interconnects are at respective interfaces between adjacent layers, each interface comprises bond-pads (e.g., 132, 134) and the dielectric material (e.g., 108), and the first interconnects comprise metal-metal bonds between the bond pads (e.g., 132, 134) and dielectric-dielectric bonds between the dielectric material.

Example 21 provides the microelectronic assembly of example 20, in which some of the bond-pads and some portions of the dielectric material are in the IC dies of the adjacent layers, and others of the bond-pads and other portions of the dielectric material are around the IC dies of the adjacent layers.

Example 22 provides the microelectronic assembly of any one of examples 1-21, further comprising a plurality of TDVs in the end layer.

Example 23 provides the microelectronic assembly of example 22, in which the TDVs are trench vias arranged in rows between the IC dies in the end layer.

Example 24 provides the microelectronic assembly of any one of examples 1-23, further comprising one or more TDVs in at least another layer of the plurality of layers.

Example 25 provides the microelectronic assembly of any one of examples 1-24, in which the TDV is a trench via.

Example 26 provides the microelectronic assembly of any one of examples 1-25, in which the power circuit comprises voltage regulators and a power source.

Example 27 provides the microelectronic assembly of any one of examples 1-26, in which the package substrate comprises conductive traces (e.g., 138) in an organic insulator (e.g., 140).

Example 28 provides the microelectronic assembly of any one of examples 1-27, in which the plurality of IC dies is coupled to the package substrate by second-level interconnects (SLI) (e.g., 142).

Example 29 provides a microelectronic assembly (e.g., 100), comprising: a package substrate (e.g., 118); a first IC die (e.g., 104A) coupled to the package substrate; a second IC die (e.g., 104B, 104C) coupled to the first IC die, the second IC die being surrounded by a dielectric material (e.g., 108); a support structure (e.g., 112) coupled to the second IC die on a side of the second IC die opposite to the first IC die, the support structure comprising a power plane (e.g., 114) configured to be conductively coupled to one or more power sources, in which: the first IC die is coupled to the power plane of the support structure by through-dielectric vias (TDVs) (e.g., 110) in the dielectric material surrounding the second IC die, and the second IC die is coupled to the power plane of the support structure by first-level interconnects (FLIs) (e.g., 116) having a pitch of less than 10 micrometers between adjacent interconnects.

Example 30 provides the microelectronic assembly of example 29, in which the first IC die and the second IC die are coupled by FLIs (e.g., 106) having a pitch of less than 10 micrometers between adjacent interconnects.

Example 31 provides the microelectronic assembly of any one of examples 29-30, in which the first IC die and the package substrate are coupled by second-level interconnects (SLIs) (e.g., 142) having a pitch of more than 10 micrometers between adjacent interconnects.

Example 32 provides the microelectronic assembly of any one of examples 29-31, the second IC die comprises through-substrate vias (TSVs) (e.g., 122) conductively coupled to the first-level interconnects with the power plane of the support structure.

Example 33 provides the microelectronic assembly of any one of examples 29-32, in which the FLIs are conductively coupled to first conductive traces (e.g., 124) in the second IC die, the second IC die comprises second conductive traces (e.g., 126), and the first conductive traces are thicker than the second conductive traces.

Example 34 provides the microelectronic assembly of example 33, in which the FLIs are conductively coupled to the first conductive traces by TSVs (e.g., 122) through a substrate (e.g., 128) of the second IC die.

Example 35 provides the microelectronic assembly of any one of examples 33-34, in which: the first conductive traces are in a first metallization stack, the second conductive traces are in a second metallization stack, and the first metallization stack is separated from the second metallization stack by a substrate (e.g., 128).

Example 36 provides the microelectronic assembly of example 35, in which (e.g., FIG. 2B): the first metallization stack is proximate to the FLIs, and the FLIs are conductively coupled to the first conductive traces by conductive vias in the first metallization stack.

Example 37 provides the microelectronic assembly of any one of examples 35-36, in which (e.g., FIG. 6) the first metallization stack is conductively coupled to the second metallization by TSVs in the substrate.

Example 38 provides the microelectronic assembly of example 35, in which (e.g., FIG. 5): the second metallization stack is proximate to the FLIs, and the FLIs are conductively coupled to the first conductive traces by a conductive via (e.g., 404) through the second metallization stack and the substrate.

Example 39 provides the microelectronic assembly of any one of examples 33-38, in which the first conductive traces are configured to carry power and the second conductive traces are configured to carry signals.

Example 40 provides the microelectronic assembly of any one of examples 29-39, in which the TDVs are coupled to the power plane of the support structure and to the first IC die by first-level interconnects having a pitch of less than 10 micrometers between adjacent interconnects.

Example 41 provides the microelectronic assembly of any one of examples 29-40, in which the dielectric material comprises a compound of silicon and at least one of oxygen, nitrogen and carbon.

Example 42 provides the microelectronic assembly of any one of examples 29-41, in which the TDVs are trench vias.

Example 43 provides the microelectronic assembly of any one of examples 29-42, in which the support structure is a silicon wafer.

Example 44 provides a method for fabricating a microelectronic assembly, the method comprising: providing a reconstituted wafer (e.g., 102(1)) comprising a plurality of IC dies (e.g., 104A); forming an interface layer comprising bond-pads (e.g., 132) and a dielectric material layer; coupling an additional reconstituted wafer (e.g., 102(2)) to the interface layer, the additional reconstituted wafer comprising another plurality of IC dies (e.g., 104B, 104C) and TDVs (e.g., 110) in a dielectric material (e.g., 108) around the IC dies; repeating forming the interface layer and coupling the additional reconstituted wafer until a desired stack of IC dies having a plurality of layers in the stack is obtained; coupling a support structure to a topmost layer in the plurality of layers, the support structure comprising a power plane.

Example 45 provides the method of example 44, in which the additional reconstituted wafer is formed by a process comprising: coupling known good IC dies to a carrier; forming copper pillars around the IC dies; depositing the dielectric material around the copper pillars and the IC dies; and removing the carrier.

Example 46 provides the method of example 44, in which the additional reconstituted wafer is formed by a process comprising: coupling known good IC dies to a carrier; depositing the dielectric material around the IC dies; forming vias in the dielectric material; depositing conductive material in the dielectric material to form the TDVs; and removing the carrier.

Example 47 provides the method of any one of examples 44-46, in which the TDVs are trench vias arranged in rows between adjacent IC dies.

Example 48 provides the method of any one of examples 44-47, in which coupling the additional reconstituted wafer comprises forming metal-metal bonds and dielectric-dielectric bonds with the interface layer.

Example 49 provides the method of any one of examples 44-48, in which coupling the support structure to the topmost layer comprises forming metal-metal bonds and dielectric-dielectric bonds with the topmost layer.

Example 50 provides the method of any one of examples 44-49, in which coupling the support structure to the topmost layer comprises: forming another interface layer over the topmost layer; forming the power plane over the another interface layer; and depositing a layer comprising silicon and oxygen over the power plane.

Example 51 provides the method of any one of examples 44-50, in which TDVs in the topmost layer are coupled to the power plane of the support structure.

Example 52 provides the method of any one of examples 44-51, in which TDVs in two adjacent layers in the plurality of layers are coupled by interconnects having a pitch of less than 10 micrometers between adjacent interconnects.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
a plurality of layers of integrated circuit (IC) dies, each layer coupled to adjacent layers by first interconnects having a pitch of less than 10 micrometers between adjacent first interconnects, wherein an end layer in the plurality of layers is proximate to a first side of the plurality of layers;
a support structure coupled to the first side of the plurality of layers, the support structure comprising a structurally stiff base with conductive traces proximate to the end layer, the conductive traces coupled to the end layer by second interconnects having a pitch of less than 10 micrometers between adjacent second interconnects; and
a package substrate coupled to a second side of the plurality of layers, the second side being opposite to the first side,
wherein:
the end layer comprises a dielectric material around IC dies in the end layer and a through-dielectric via (TDV) in the dielectric material of the end layer,
the conductive traces in the support structure are coupled by the second interconnects to the TDV in the end layer, and
the conductive traces in the support structure are conductively coupled to a power circuit.

2. The microelectronic assembly of claim 1, wherein:
the end layer is a first end layer, and
IC dies in a second end layer proximate to the second side of the plurality of layers comprises through-substrate vias (TSVs).

3. The microelectronic assembly of claim 1, further comprising:
a first type of conductive traces; and
a second type of conductive traces,
wherein:
the first type of conductive traces is larger than the second type of conductive traces,
the first type of conductive traces is configured to carry power and is conductively coupled to the power circuit, and
the second type of conductive traces is configured to conduct electrical signals and is not conductively coupled to the power circuit.

4. The microelectronic assembly of claim 3, wherein:

the IC dies comprise respective substrates attached to respective metallization stacks, and the respective metallization stacks include the dielectric material, the first type of conductive traces, and the second type of conductive traces.

5. The microelectronic assembly of claim 4, wherein:

the respective metallization stack in at least one IC die in the end layer is on one side of the respective substrate, the first type of conductive traces and the second type of conductive traces are in correspondingly separate layers within the respective metallization stack, the at least one IC die in the end layer comprises TSVs in the respective substrate, each TSV has a first end proximate to the first interconnects, and a second end distant from the first interconnects, the second end being proximate to the one side of the respective substrate, the first end is coupled to the conductive traces in the support structure by the first interconnects, and the second end is coupled to the first type of conductive traces in the respective metallization stack of the at least one IC die.

6. The microelectronic assembly of claim 4, wherein:

at least one IC die in the end layer comprises a first metallization stack on one side of the respective substrate and a second metallization stack on an opposing side of the respective substrate, the first type of conductive traces is in the first metallization stack, and the second type of conductive traces is in the second metallization stack, and the first type of conductive traces is coupled to the conductive traces in the support structure by the first interconnects.

7. The microelectronic assembly of claim 1, further comprising a plurality of TDVs in the end layer.

8. The microelectronic assembly of claim 7, wherein the TDVs are trench vias arranged in rows between the IC dies in the end layer.

9. A microelectronic assembly, comprising:

a package substrate;

a first IC die coupled to the package substrate;

a second IC die coupled to the first IC die, the second IC die being surrounded by a dielectric material; and a support structure coupled to the second IC die on a side of the second IC die opposite to the first IC die, the support structure comprising a power plane configured to be conductively coupled to one or more power sources, wherein:

the first IC die is coupled to the power plane of the support structure by through-dielectric vias (TDVs) in the dielectric material surrounding the second IC die, and the second IC die is coupled to the power plane of the support structure by first-level interconnects (FLIs) having a pitch of less than 10 micrometers between adjacent interconnects.

10. The microelectronic assembly of claim 9, wherein the first IC die and the second IC die are coupled by FLIs having a pitch of less than 10 micrometers between adjacent interconnects.

11. The microelectronic assembly of claim 9, the second IC die comprises through-substrate vias (TSVs) conductively coupled to the first-level interconnects with the power plane of the support structure.

12. The microelectronic assembly of claim 9, wherein the FLIs are conductively coupled to first conductive traces in the second IC die, the second IC die comprises second conductive traces, and the first conductive traces are thicker than the second conductive traces.

13. The microelectronic assembly of claim 12, wherein:

the first conductive traces are in a first metallization stack, the second conductive traces are in a second metallization stack, and the first metallization stack is separated from the second metallization stack by a substrate.

14. The microelectronic assembly of claim 9, wherein the dielectric material comprises a compound of silicon and at least one of oxygen, nitrogen and carbon.

15. The microelectronic assembly of claim 9, wherein the support structure is a silicon wafer.

* * * * *